United States Patent
Kim et al.

(10) Patent No.: US 7,588,980 B2
(45) Date of Patent: Sep. 15, 2009

(54) METHODS OF CONTROLLING MORPHOLOGY DURING EPITAXIAL LAYER FORMATION

(75) Inventors: Yihwan Kim, Milpitas, CA (US); Andrew M. Lam, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 61 days.

(21) Appl. No.: 11/830,830

(22) Filed: Jul. 30, 2007

(65) Prior Publication Data

US 2008/0026549 A1    Jan. 31, 2008

Related U.S. Application Data

(60) Provisional application No. 60/820,956, filed on Jul. 31, 2006.

(51) Int. Cl.
     *H01L 21/8238* (2006.01)
(52) U.S. Cl. ............... 438/222; 438/311; 438/416; 438/513; 257/E21.115; 257/E21.182; 257/E21.311; 257/E21.561; 257/E21.571
(58) Field of Classification Search ......... 438/9, 438/222, 197, 513, 416, 911, 752, 753, 933
    See application file for complete search history.

(56) References Cited

U.S. PATENT DOCUMENTS

| | | |
|---|---|---|
| 3,675,619 A | 7/1972 | Burd |
| 4,429,324 A | 1/1984 | Wilkens |
| 4,834,831 A | 5/1989 | Nishizawa et al. |
| 5,112,439 A | 5/1992 | Reisman et al. |
| 5,236,545 A | 8/1993 | Pryor |
| 5,273,930 A | 12/1993 | Steele et al. |
| 5,288,658 A | 2/1994 | Ishihara |
| 5,294,286 A | 3/1994 | Nishizawa et al. |
| 5,360,760 A | 11/1994 | Hayashi |
| 5,372,860 A | 12/1994 | Fehlner et al. |
| 5,374,570 A | 12/1994 | Nasu et al. |
| 5,469,806 A | 11/1995 | Mochizuki et al. |
| 5,480,818 A | 1/1996 | Matsumoto et al. |
| 5,503,875 A | 4/1996 | Imai et al. |
| 5,521,126 A | 5/1996 | Okamura et al. |
| 5,527,733 A | 6/1996 | Nishizawa et al. |

(Continued)

FOREIGN PATENT DOCUMENTS

EP    1 150 345 A2    10/2001

(Continued)

OTHER PUBLICATIONS

Waite, A.M. et al., "Raised Source/Drains for 50mm MOSFETs Using A Silane/Discblorosilane Mixture Por Selective Epitaxy", Received on Jan. 7, 2004, Elsevier Ltd.—Solid-State Electronics 49 (2005), pp. 529-534.

(Continued)

*Primary Examiner*—David Nhu
(74) *Attorney, Agent, or Firm*—Dugan & Dugan, PC

(57) ABSTRACT

A first aspect of the invention provides a method of selectively forming an epitaxial layer on a substrate. The method includes heating the substrate to a temperature of less than about 800° C. and employing both silane and dichlorosilane as silicon sources during epitaxial film formation. Numerous other aspects are provided.

21 Claims, 2 Drawing Sheets

U.S. PATENT DOCUMENTS

| | | |
|---|---|---|
| 5,674,304 A | 10/1997 | Fukada et al. |
| 5,693,139 A | 12/1997 | Nishizawa et al. |
| 5,796,116 A | 8/1998 | Nakata et al. |
| 5,807,792 A | 9/1998 | Ilg et al. |
| 5,849,092 A | 12/1998 | Xi et al. |
| 5,906,680 A | 5/1999 | Meyerson |
| 5,916,365 A | 6/1999 | Sherman |
| 6,019,839 A * | 2/2000 | Achutharaman et al. ...... 117/88 |
| 6,025,627 A | 2/2000 | Forbes et al. |
| 6,042,654 A | 3/2000 | Comita et al. |
| 6,055,927 A | 5/2000 | Shang et al. |
| 6,110,291 A | 8/2000 | Haruta et al. |
| 6,124,158 A | 9/2000 | Dautartas et al. |
| 6,144,060 A | 11/2000 | Park et al. |
| 6,159,852 A | 12/2000 | Nuttall et al. |
| 6,177,717 B1 | 1/2001 | Chantre et al. |
| 6,200,893 B1 | 3/2001 | Sneh |
| 6,207,487 B1 | 3/2001 | Kim et al. |
| 6,228,728 B1 | 5/2001 | Furukawa et al. |
| 6,232,196 B1 | 5/2001 | Raaijmakers et al. |
| 6,270,572 B1 | 8/2001 | Kim et al. |
| 6,284,646 B1 | 9/2001 | Leem |
| 6,284,686 B1 | 9/2001 | Marlor |
| 6,287,965 B1 | 9/2001 | Kang et al. |
| 6,291,319 B1 | 9/2001 | Yu et al. |
| 6,305,314 B1 | 10/2001 | Sneh et al. |
| 6,335,280 B1 | 1/2002 | van der Jeugd |
| 6,342,277 B1 | 1/2002 | Sherman |
| 6,348,420 B1 | 2/2002 | Raaijmakers et al. |
| 6,352,945 B1 | 3/2002 | Matsuki et al. |
| 6,358,829 B2 | 3/2002 | Yoon et al. |
| 6,383,955 B1 | 5/2002 | Matsuki et al. |
| 6,391,785 B1 | 5/2002 | Satta et al. |
| 6,391,803 B1 | 5/2002 | Kim et al. |
| 6,399,491 B2 | 6/2002 | Jeon et al. |
| 6,410,463 B1 | 6/2002 | Matsuki |
| 6,451,119 B2 | 9/2002 | Sneh et al. |
| 6,458,718 B1 | 10/2002 | Todd |
| 6,462,367 B2 | 10/2002 | Marsh et al. |
| 6,468,924 B2 | 10/2002 | Lee et al. |
| 6,489,241 B1 | 12/2002 | Thilderkvist et al. |
| 6,492,283 B2 | 12/2002 | Raaijmakers et al. |
| 6,511,539 B1 | 1/2003 | Raaijmakers |
| 6,534,395 B2 | 3/2003 | Werkhoven et al. |
| 6,544,900 B2 | 4/2003 | Raaijmakers et al. |
| 6,559,520 B2 | 5/2003 | Matsuki et al. |
| 6,562,720 B2 | 5/2003 | Thilderkvist et al. |
| 6,576,535 B2 | 6/2003 | Drobny et al. |
| 6,590,344 B2 | 7/2003 | Tao et al. |
| 6,620,670 B2 | 9/2003 | Song et al. |
| 6,630,413 B2 | 10/2003 | Todd |
| 6,632,279 B1 | 10/2003 | Ritala et al. |
| 6,653,212 B1 | 11/2003 | Yamanaka et al. |
| 6,656,812 B1 | 12/2003 | Marty et al. |
| 6,776,841 B2 | 8/2004 | Pyi |
| 6,797,558 B2 | 9/2004 | Nuttall et al. |
| 6,821,825 B2 | 11/2004 | Todd |
| 6,998,305 B2 | 2/2006 | Arena et al. |
| 7,045,840 B2 | 5/2006 | Tamai |
| 7,121,286 B2 | 10/2006 | Nakao |
| 7,230,274 B2 | 6/2007 | O'Loughlin et al. |
| 7,235,492 B2 * | 6/2007 | Samoilov .................. 438/714 |
| 7,312,128 B2 | 12/2007 | Kim |
| 7,353,841 B2 | 4/2008 | Kono et al. |
| 7,354,821 B2 | 4/2008 | Chung et al. |
| 7,361,563 B2 | 4/2008 | Shin et al. |
| 7,438,760 B2 * | 10/2008 | Bauer et al. .................. 117/89 |
| 2001/0000866 A1 | 5/2001 | Sneh et al. |
| 2001/0020712 A1 | 9/2001 | Raaijmakers et al. |
| 2001/0024387 A1 | 9/2001 | Raaijmakers et al. |
| 2001/0024871 A1 | 9/2001 | Yagi |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0046567 A1 | 11/2001 | Matsuki et al. |
| 2001/0055672 A1 | 12/2001 | Todd |
| 2002/0000598 A1 | 1/2002 | Kang et al. |
| 2002/0016084 A1 | 2/2002 | Todd |
| 2002/0022347 A1 | 2/2002 | Park et al. |
| 2002/0031618 A1 | 3/2002 | Sherman |
| 2002/0047151 A1 | 4/2002 | Kim et al. |
| 2002/0060363 A1 | 5/2002 | Xi et al. |
| 2002/0074588 A1 | 6/2002 | Lee |
| 2002/0076837 A1 | 6/2002 | Hujanen et al. |
| 2002/0090818 A1 | 7/2002 | Thilderkvist et al. |
| 2002/0093042 A1 | 7/2002 | Oh et al. |
| 2002/0098627 A1 | 7/2002 | Pomarede et al. |
| 2002/0117399 A1 | 8/2002 | Chen et al. |
| 2002/0145168 A1 | 10/2002 | Bojarczuk, Jr. et al. |
| 2002/0155722 A1 | 10/2002 | Satta et al. |
| 2002/0168868 A1 | 11/2002 | Todd |
| 2002/0172768 A1 | 11/2002 | Endo et al. |
| 2002/0173113 A1 | 11/2002 | Todd |
| 2002/0173130 A1 | 11/2002 | Pomerede et al. |
| 2002/0197831 A1 | 12/2002 | Todd et al. |
| 2002/0197881 A1 | 12/2002 | Ramdani et al. |
| 2003/0013320 A1 | 1/2003 | Kim et al. |
| 2003/0015764 A1 | 1/2003 | Raaijmakers et al. |
| 2003/0022528 A1 | 1/2003 | Todd |
| 2003/0032281 A1 | 2/2003 | Werkhoven et al. |
| 2003/0036268 A1 | 2/2003 | Brabant et al. |
| 2003/0049942 A1 | 3/2003 | Haukka et al. |
| 2003/0060057 A1 | 3/2003 | Raaijmakers et al. |
| 2003/0066486 A1 | 4/2003 | Zheng et al. |
| 2003/0072884 A1 | 4/2003 | Zhang et al. |
| 2003/0072975 A1 | 4/2003 | Shero et al. |
| 2003/0079677 A1 | 5/2003 | Pyi |
| 2003/0082300 A1 | 5/2003 | Todd et al. |
| 2003/0089308 A1 | 5/2003 | Raaijmakers |
| 2003/0089942 A1 | 5/2003 | Bhattacharyya |
| 2003/0101927 A1 | 6/2003 | Raaijmakers |
| 2003/0106490 A1 | 6/2003 | Jallepally et al. |
| 2003/0108674 A1 | 6/2003 | Chung et al. |
| 2003/0116804 A1 | 6/2003 | Visokay et al. |
| 2003/0124262 A1 | 7/2003 | Chen et al. |
| 2003/0129826 A1 | 7/2003 | Werkhoven et al. |
| 2003/0143841 A1 | 7/2003 | Yang et al. |
| 2003/0160277 A1 | 8/2003 | Bhattacharyya |
| 2003/0162370 A1 | 8/2003 | Sukegawa et al. |
| 2003/0166318 A1 | 9/2003 | Zheng et al. |
| 2003/0172872 A1 | 9/2003 | Thakur et al. |
| 2003/0173586 A1 | 9/2003 | Moriwaki et al. |
| 2003/0185980 A1 | 10/2003 | Endo |
| 2003/0186561 A1 | 10/2003 | Law et al. |
| 2003/0188682 A1 | 10/2003 | Tois et al. |
| 2003/0189208 A1 | 10/2003 | Law et al. |
| 2003/0189232 A1 | 10/2003 | Law et al. |
| 2003/0190423 A1 | 10/2003 | Yang et al. |
| 2003/0190497 A1 | 10/2003 | Yang et al. |
| 2003/0194853 A1 | 10/2003 | Jeon |
| 2003/0198754 A1 | 10/2003 | Xi et al. |
| 2003/0207555 A1 | 11/2003 | Takayanagi et al. |
| 2003/0213560 A1 | 11/2003 | Wang et al. |
| 2003/0213977 A1 | 11/2003 | Toyoda et al. |
| 2003/0215570 A1 | 11/2003 | Seutter et al. |
| 2003/0216981 A1 | 11/2003 | Tillman |
| 2003/0224566 A1 | 12/2003 | Clampitt et al. |
| 2003/0232554 A1 | 12/2003 | Blum et al. |
| 2003/0235961 A1 | 12/2003 | Metzner et al. |
| 2004/0007747 A1 | 1/2004 | Visokay et al. |
| 2004/0009307 A1 | 1/2004 | Koh et al. |
| 2004/0009675 A1 | 1/2004 | Eissa et al. |
| 2004/0016973 A1 | 1/2004 | Rotondaro et al. |
| 2004/0023462 A1 | 2/2004 | Rotondaro et al. |

| | | | |
|---|---|---|---|
| 2004/0033674 A1 | 2/2004 | Todd | |
| 2004/0033698 A1 | 2/2004 | Lee et al. | |
| 2004/0043149 A1 | 3/2004 | Gordon et al. | |
| 2004/0043569 A1 | 3/2004 | Ahn et al. | |
| 2004/0053484 A1 | 3/2004 | Kumar et al. | |
| 2004/0171238 A1 | 9/2004 | Arena et al. | |
| 2004/0175950 A1 | 9/2004 | Puppo et al. | |
| 2004/0182423 A1 | 9/2004 | Nakao | |
| 2004/0226911 A1 | 11/2004 | Dutton et al. | |
| 2004/0235229 A1 | 11/2004 | Hokazono | |
| 2004/0253776 A1 | 12/2004 | Hoffmann et al. | |
| 2005/0054171 A1 | 3/2005 | Chu et al. | |
| 2005/0093154 A1 | 5/2005 | Kottantharayil et al. | |
| 2005/0170604 A1 | 8/2005 | Orlowski et al. | |
| 2005/0191866 A1 | 9/2005 | Powell | |
| 2005/0241671 A1 | 11/2005 | Dong et al. | |
| 2005/0263795 A1 | 12/2005 | Choi et al. | |
| 2005/0266692 A1 | 12/2005 | Brask | |
| 2005/0277272 A1 | 12/2005 | Singh et al. | |
| 2006/0057821 A1 | 3/2006 | Lee et al. | |
| 2006/0115933 A1 | 6/2006 | Ye et al. | |
| 2006/0115934 A1 | 6/2006 | Kim et al. | |
| 2006/0166414 A1 | 7/2006 | Carlson et al. | |
| 2006/0234504 A1 | 10/2006 | Bauer et al. | |
| 2006/0260538 A1 | 11/2006 | Ye et al. | |
| 2007/0108450 A1 | 5/2007 | O'Loughlin et al. | |
| 2007/0117414 A1 | 5/2007 | Moffatt | |
| 2007/0259112 A1 | 11/2007 | Ishikawa | |
| 2007/0286956 A1 | 12/2007 | Samoilov | |
| 2008/0022924 A1 | 1/2008 | Kim | |
| 2008/0026549 A1 | 1/2008 | Kim et al. | |
| 2008/0044932 A1 | 2/2008 | Samoilov | |

FOREIGN PATENT DOCUMENTS

| | | |
|---|---|---|
| EP | 1 598 881 | 11/2005 |
| GB | 2 355 727 | 5/2001 |
| JP | 58-097917 | 6/1983 |
| JP | 62-171999 | 7/1987 |
| JP | 63-062313 | 3/1988 |
| JP | 01-143221 | 6/1989 |
| JP | 01-270593 | 10/1989 |
| JP | 02-172895 | 7/1990 |
| JP | 03-286522 | 12/1991 |
| JP | 05-047665 | 2/1993 |
| JP | 05-102189 | 4/1993 |
| JP | 05-251339 | 9/1993 |
| JP | 06-196809 | 7/1994 |
| JP | 07300649 | 11/1995 |
| JP | 2001-111000 | 4/2001 |
| JP | 2001-172767 | 6/2001 |
| JP | 2001-189312 | 7/2001 |
| WO | WO 98/20524 A1 | 5/1998 |
| WO | WO 00/16377 A2 | 3/2000 |
| WO | WO 01/15220 A1 | 3/2000 |
| WO | WO 00/54320 A1 | 9/2000 |
| WO | WO 01/17692 A1 | 3/2001 |
| WO | WO 01/29893 A1 | 4/2001 |
| WO | WO 01/40541 A1 | 6/2001 |
| WO | WO 01/41544 A2 | 6/2001 |
| WO | WO 01/66832 A2 | 9/2001 |
| WO | WO 02/43115 A2 | 5/2002 |
| WO | WO 02/45167 A2 | 6/2002 |
| WO | WO 02/064853 A2 | 8/2002 |
| WO | WO 02/065508 A2 | 8/2002 |
| WO | WO 02/065516 A2 | 8/2002 |
| WO | WO 02/065517 A2 | 8/2002 |
| WO | WO 02/065525 A1 | 8/2002 |
| WO | WO 02/080244 A2 | 10/2002 |
| WO | WO 02/097864 A2 | 12/2002 |
| WO | WO 2005/071719 | 8/2005 |
| WO | WO2006/060543 | 6/2006 |
| WO | WO2008/033186 | 3/2008 |
| WO | WO 2007/112058 | 11/2008 |

OTHER PUBLICATIONS

Maruno et al., "Selective Epitaxial Growth by Ultrahigh-Vacuum Chemical Vapor Deposition with Alternating Gas Supply of $Si_2H_6$ and $CI_2$", Nov. 2000, Jpn. J. Appl. Phys. vol. 39, Part 1, No. 11, pp. 6139-6142.

Kim et al., "Low temperature selectivity Si epitaxy by reduced pressure chemical vapor deposition introducing periodic deposition and etching cycles with $SiH_4$, $H_2$ and HCl", Mat. Res. Soc. Symp. Proc., pp. A8.2.1-A8.2.6 (2000).

Mercier, et al., "Kinetic Aspects of Selective Epitaxial Growth Using a Rapid Thermal Processing System", Journal or Crystal Growth, 94, pp. 885-894 (1989).

Miyauchi, et al., "Low-Temperature (850° C.) Silicon Selective Epitaxial Growth on HF-Treated Si(100) Substrates Using $SiH_4$-$HCl$-$H_2$ Systems", J. Electrochem. Soc., vol. 138, No. 11, Nov. 1991, pp. 3480-3483.

Ribot, et al., "Low-temperature selective epitaxy of silicon with chlorinated chemistry by RTCVD", Materials Science and Engineering B89, pp. 306-309 (2002).

Agarwal, et al., "Challenges in Integrating the High-K Gate Dielectric Film to the Conventional CMOS Process Flow," Mat. Sec. Soc. Sump. Proc. vol. 670 (2001) pp. K2.1.1-K2.1.11.

Bedair, S.M., "Atomic Layer Epitaxy Deposition Processes," J. Vac. Sci. Technol. B., vol. 12, No. 1, Jan./Feb. 1994, pp. 2-8.

Choi, et al., "Stability of $TiB_2$ as a Diffusion Barrier on Silicon," J. Electrochem. Soc., vol. 138, No. 10, Oct. 1991, pp. 3062-3067.

Choi, et al., The Effect of Annealing on Resistivity of Low Pressure Chemical Vapor Deposited Titanium Diboride, J. Appl. Phys. 69(11), Jun. 1, 1991, pp. 7853-7861.

Derbyshire, K., "Applications of Integrated Processing," Solid State Technology, Dec. 1994 pp. 45-48.

Elers, et al., "$NbCI_5$ as a Precursor in Atomic Layer Epitaxy," Applied Surface Science 82/83 (1994) pp. 468-474.

George, et al., "Surface Chemistry for Atomic Layer Growth," J. Phys. Chem. 1996, 100, pp. 13121-13131.

Hwang, et al., "Nanometer-Size a-$PbO_2$-Type $TiO_2$ in Garnet: A Thermobarometer for Ultrahigh Pressure Metamorphism," Science Vo. 288 (Apr. 14, 2000) pp. 321-324.

Jeong, et al., "Growth and Characterization of Aluminum Oxide ($Al_2O_3$) Thin Films by Plasma Assisted Atomic Layer Controlled Deposition," J. Korean Inst. Met. Mater., vol. 38, No. 10, Oct. 2000 pp. 1395-1399.

Jeong, et al., "Plasma-assisted Atomic Layer Growth of High-Quality Aluminum Oxide Thin Films," Jpn. J. Appl. Phys. 1, Regul. Pap. Short Notes, vol. 40, No. 1, Jan. 2001 pp. 285-289.

Lee, et al., "Cyclic Technique for the Enhancement of Highly Oriented Diamond Film Growth," Thin Solid Films 303 (1997) pp. 264-268.

Min, et al., "Chemical Vapor Deposition of Ti-Si-N Films with Alternating Source Supply," Mat. Res. Soc. Proc. vol. 564 (1999) pp. 207-210.

Min, et al., "Metal-organic Atomic-layer Deposition of Titanium-silicon-nitride Films," Applied Physics Letters, vol. 75, No. 11 (Sep. 11, 1999) pp. 1521-1523.

Paranjpe, et al., "Atomic Layer Deposition of $AlO_x$ for Thin Film Head Gap Applications," J. Electrochem. Soc., vol. 148, No. 9, Sep. 2001 pp. G465-G471.

Ritala, et al., "Atomic Layer Deposition of Oxide Thin Films with Metal Alkoxides as Oxygen Sources," Science vol. 288 Apr. 14, 2000 pp. 319-321.

Kamins, et al., "Kinetics of selective epitaxial deposition of $Si_{1-x}Ge_x$," Applied Physics Letters, American Institute of Physics. New York, US, vol. 61, No. 6, Aug. 10, 1992, pp. 669-671.

Menon, et al., "Loading effect in SiGe layers grown by dichlorosilane- and silane-based epitaxy", Journal of Applied Physics, American Institute of Physics. New York, US, vol. 90, No. 9, Nov. 1, 2001, pp. 4805-4809.

Sedgwick, et al., "Selective SiGe and heavily As doped Si deposited at low temperature by atmospheric pressure chemical vapor deposition", Journal of Vacuum Science and Technology: Part B, American Institute of Physics. New York, US, vol. 11, No. 3, May 1, 1993, pp. 1124-1128.

Uchino, et al., "A Raised Source/Drain Technology Using In-situ P-doped SiGe and B-doped Si for 0.1 μm CMOS ULSIs", Electron Devices Meeting, 1997. Technical Digest, International Washington, DC, USA Dec. 7-10, 1991, New York, NY, USA, IEEE, US, Dec. 7, 1997, pp. 479-482.

Office Action of China Application No. 200580043510.6 (9618-PCT-02-CHI) mailed Nov. 29, 2008.

International Search Report and Written Opinion of International Application No. PCT/US05/42991 mailed Nov. 20, 2006.

International Preliminary Report on Patentability of PCT/US05/042991 issued Jun. 5, 2007.

International Preliminary Report on Patentability of PCT/US05/043420 mailed Jun. 14, 2007.

International Preliminary Report on Patentability of PCT/US07/017053 mailed Feb. 12, 2009.

International Search Report and Written Opinion of PCT/US07/17053 dated Dec. 6, 2007.

International Search Report and Written Opinion of PCT/US05/043420 dated Jul. 17, 2006.

Waite "Raised Sources/Drains for 50nm MOSFETS using a Silane/Dichlorosilane Mixture for Selective Epitaxy", Solid State Electronics 49 (2005) pp. 529-534.

* cited by examiner

METHODS OF CONTROLLING MORPHOLOGY DURING EPITAXIAL LAYER FORMATION The present application claims priority from U.S. Provisional Patent Application Ser. No. 60/820,956, filed Jul. 31, 2006, which is hereby incorporated by reference herein in its entirety.

CROSS REFERENCE TO RELATED APPLICATIONS

The present application is related to the following co-pending applications, each of which is hereby incorporated by reference herein in its entirety:

U.S. patent application Ser. No. 11/001,774, filed Dec. 1, 2004; and

U.S. patent application Ser. No. 11/227,974, filed Sep. 14, 2005.

FIELD OF THE INVENTION

The present invention relates to semiconductor device manufacturing, and more particularly to methods of controlling morphology during epitaxial layer formation.

BACKGROUND

As smaller transistors are manufactured, ultra shallow source/drain junctions are becoming more challenging to produce. Generally, sub-100 nm CMOS (complementary metal-oxide semiconductor) devices require a junction depth to be less than 30 nm. Selective epitaxial deposition is often utilized to form epilayers of silicon-containing materials (e.g., Si, SiGe and SiC) into the junctions. Generally, selective epitaxial deposition permits growth of epilayers on silicon moats with no growth on dielectric areas. Selective epitaxy can be used within semiconductor devices, such as elevated source/drains, source/drain extensions, contact plugs or base layer deposition of bipolar devices.

Generally, a selective epitaxy process involves a deposition reaction and an etch reaction. The deposition and etch reactions occur simultaneously with relatively different reaction rates to an epitaxial layer and to a polycrystalline layer. During the deposition process, the epitaxial layer is formed on a monocrystalline surface while a polycrystalline layer is deposited on at least a second layer, such as an existing polycrystalline layer and/or an amorphous layer. However, the deposited polycrystalline layer is generally etched at a faster rate than the epitaxial layer. Therefore, by changing the concentration of an etchant gas, the net selective process results in deposition of epitaxy material and limited, or no, deposition of polycrystalline material. For example, a selective epitaxy process may result in the formation of an epilayer of silicon-containing material on a monocrystalline silicon surface while no deposition is left on a spacer region.

Selective epitaxy deposition of silicon-containing materials has become a useful technique during formation of elevated source/drain and source/drain extension features, for example, during the formation of silicon-containing MOSFET (metal oxide semiconductor field effect transistor) devices. Source/drain extension features are manufactured by etching a silicon surface to make a recessed source/drain feature and subsequently filling the etched surface with a selectively grown epilayer, such as a silicon germanium (SiGe) material. Selective epitaxy permits near complete dopant activation with in-situ doping, so that the post annealing process is omitted. Therefore, junction depth can be defined accurately by silicon etching and selective epitaxy. On the other hand, the ultra shallow source/drain junction inevitably results in increased series resistance. Also, junction consumption during silicide formation increases the series resistance even further. In order to compensate for junction consumption, an elevated source/drain is epitaxially and selectively grown on the junction. Typically, the elevated source/drain layer is undoped silicon.

However, current selective epitaxy processes have some drawbacks. In order to maintain selectivity during present epitaxy processes, chemical concentrations of the precursors, as well as reaction temperatures must be regulated and adjusted throughout the deposition process. If not enough silicon precursor is administered, then the etching reaction may dominate and the overall process is slowed down. Also, harmful over etching of substrate features may occur. If not enough etchant precursor is administered, then the deposition reaction may dominate reducing the selectivity to form monocrystalline and polycrystalline materials across the substrate surface. Also, current selective epitaxy processes usually require a high reaction temperature, such as about 800° C., 1,000° C. or higher. Such high temperatures are not desirable during a fabrication process due to thermal budget considerations and possible uncontrolled nitridation reactions to the substrate surface.

Therefore, there is a need to have a process for selectively and epitaxially depositing silicon and silicon-containing compounds with optional dopants. Furthermore, the process should be versatile to form silicon-containing compounds with varied elemental concentrations while having a fast deposition rate, smooth surface morphology and maintaining a process temperature, such as about 800° C. or less, and preferably about 700° C. or less.

SUMMARY OF INVENTION

A first aspect of the invention provides a method of selectively forming an epitaxial layer on a substrate. The method includes heating the substrate to a temperature of less than about 800° C. and employing both silane and dichlorosilane as silicon sources during selective epitaxial film formation.

In another aspect of the invention a method of selectively forming an epitaxial layer on a substrate is provided. The method includes at least one deposition step and at least one etching step which are alternated. The method includes heating the substrate to a temperature of less than about 800° C. The deposition step employs both silane and dichlorosilane as silicon sources. Each of the silicon source gases are flowed at a rate from about 10 to 100 sccm at a chamber pressure of about 5 to 50 Torr. The etching step includes flowing at least one of hydrogen chloride and chlorine.

In another aspect of the invention, a method of forming an epitaxial layer on a substrate is provided. The method includes (1) heating the substrate to a temperature of less than about 800° C.; and (2) performing a selective epitaxial film formation process on the substrate so as to form the epitaxial layer by employing both silane and dichlorosilane as silicon sources during the selective epitaxial film formation process. A ratio of silane to dichlorosilane is greater than 1. Numerous other aspects are provided.

DETAILED DESCRIPTION

Figure 1:
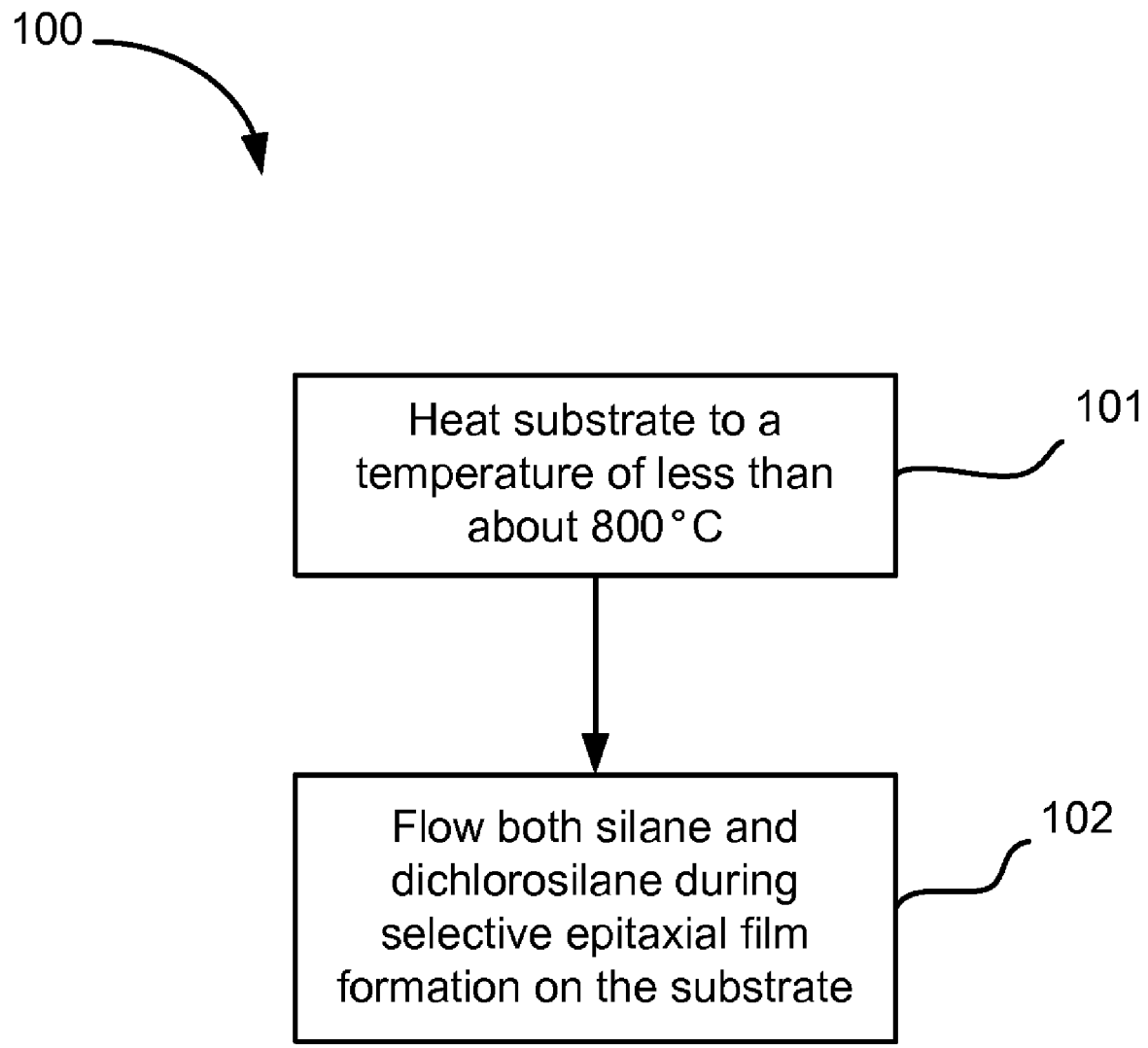
FIG. 1 is a flowchart of a first exemplary method for forming an epitaxial film in accordance with the present invention.

During a selective epitaxial growth process on a silicon substrate patterned with dielectric films, formation of single-crystal semiconductor occurs only on the exposed silicon surfaces (e.g., not on the dielectric surfaces). Selective thickness is defined as the maximum film thickness obtained on the silicon surfaces prior to the onset of film growth or nucleation on the dielectric surfaces.

Selective epitaxial growth processes may include simultaneous etch-deposition processes as well as alternating gas supply processes. In a simultaneous etch-deposition process, both etchant species and deposition species are flowed simultaneously. As such, an epitaxial layer is simultaneously deposited and etched during its formation.

U.S. patent application Ser. No. 11/001,774, filed Dec. 1, 2004, describes an alternating gas supply (AGS) process for forming epitaxial layers on a substrate. During an AGS process, an epitaxial deposition process is conducted on a substrate, and then an etching process is conducted on the substrate. The cycle of an epitaxial deposition process followed by an etching process is repeated until a desired thickness of an epitaxial layer is formed.

An alternative precursor for selective silicon epitaxy at deposition temperatures less than 800° C. is silane ($SiH_4$). At such lower temperatures, $SiH_4$ has a higher growth rate than dichlorosilane (DCS). However, the present inventors have observed that an $SiH_4$-based process may introduce morphology issues (e.g., surface roughness or pitting).

In at least one embodiment of the invention, observed morphology issues associated with the use of $SiH_4$ may be reduced and/or eliminated by employing both $SiH_4$ and DCS (e.g., by mixing $SiH_4$ and DCS during film growth). This approach is believed to alter the diffusion mechanism on the film's surface, allowing greater morphology control.

In some embodiments, the present invention may be employed with the AGS process described in U.S. patent application Ser. No. 11/001,774, filed Dec. 1, 2004, although the present invention may be used with other selective epitaxial processes.

Silicon epitaxial films formed using a selective process with only $SiH_4$ as a silicon source (e.g., during an AGS process) were found to have surfaces that are rough and pitted. Silicon epitaxial films formed using a selective process with both $SiH_4$ and DCS as silicon sources (e.g., during an AGS process) were found to have improved film morphology, such as improved surface smoothness (e.g., without pitting). Unlike other approaches such as a post-deposition smoothing step, the use of $SiH_4$ and DCS allows for in-situ control of film morphology (e.g., during epitaxial film formation) without additional process steps.

In some embodiments, an example of a process which may use a silicon source as described above may include about 10 sccm to about 100 sccm of silane. In addition, the silicon source may include about 10 sccm to about 100 sccm of dichlorosilane. In this example, during a deposition cycle in an AGS process, a chamber pressure in a range of about 5 Torr to about 50 Torr with a deposition time of about 2 to 250 seconds, and more preferably about 5 to 10 seconds and a temperature in a range between about 700° C. and about 750° C. may be employed. In some embodiments, an $SiH_4$ to DCS ratio of greater than 1 may be employed, such as 2:1, 3:1, 4:1, 5:1, 7:1, 10:1, etc., ($SiH_4$:DCS). After the deposition cycle, an etchant process may be employed, for example, with about 50 sccm to about 500 sccm of hydrogen chloride (HCl) as the etchant, a chamber pressure of about 5 Torr to about 100 Torr with a deposition time of about 2 to 250 seconds, and more preferably about 5 to 10 seconds, and a temperature in a range between about 700° C. and about 750° C. After the etch cycle, a purge cycle may be conducted for about 10 seconds at a pressure of about 5 to about 50 Torr at a temperature in a range between about 700° C. and about 750° C. Other process times, temperatures and/or flow rates may be used during deposition, etching and/or purging. For example, chlorine ($Cl_2$) or a combination of $Cl_2$ and HCl may be employed during each etch step as described in U.S. patent application Ser. No. 11/227,974, filed Sep. 14, 2005.

FIG. 1 is a flowchart of a first exemplary method 100 for forming an epitaxial film in accordance with the present invention. With reference to FIG. 1, in step 101, a substrate is loaded into a process chamber and is heated to a temperature of about 800° C. or less. In some embodiments, a lower temperature range may be used during epitaxial film formation, such as less than 750° C., less than 700° C. or less than 650° C.

In step 102, silane and dichlorosilane are flowed into the process chamber, along with a suitable carrier gas and/or dopant(s) so as to form an epitaxial film on the substrate. In some embodiments, one or more etchant gases such as HCl, $Cl_2$, a combination of HCl and $Cl_2$, etc., may be flowed at the same time as the silicon source gasses (e.g., during a simultaneous deposition-etch process). In other embodiments, a separate etchant step may be employed following deposition (e.g., during an AGS process). Deposition and etching are continued until the desired epitaxial film thickness is achieved. In some embodiments, an $SiH_4$ to DCS ratio of greater than 1 may be employed, such as 2:1, 3:1, 4:1, 5:1, 7:1, 10:1, etc., ($SiH_4$:DCS). Other silicon source ratios may be used.

Figure 2:
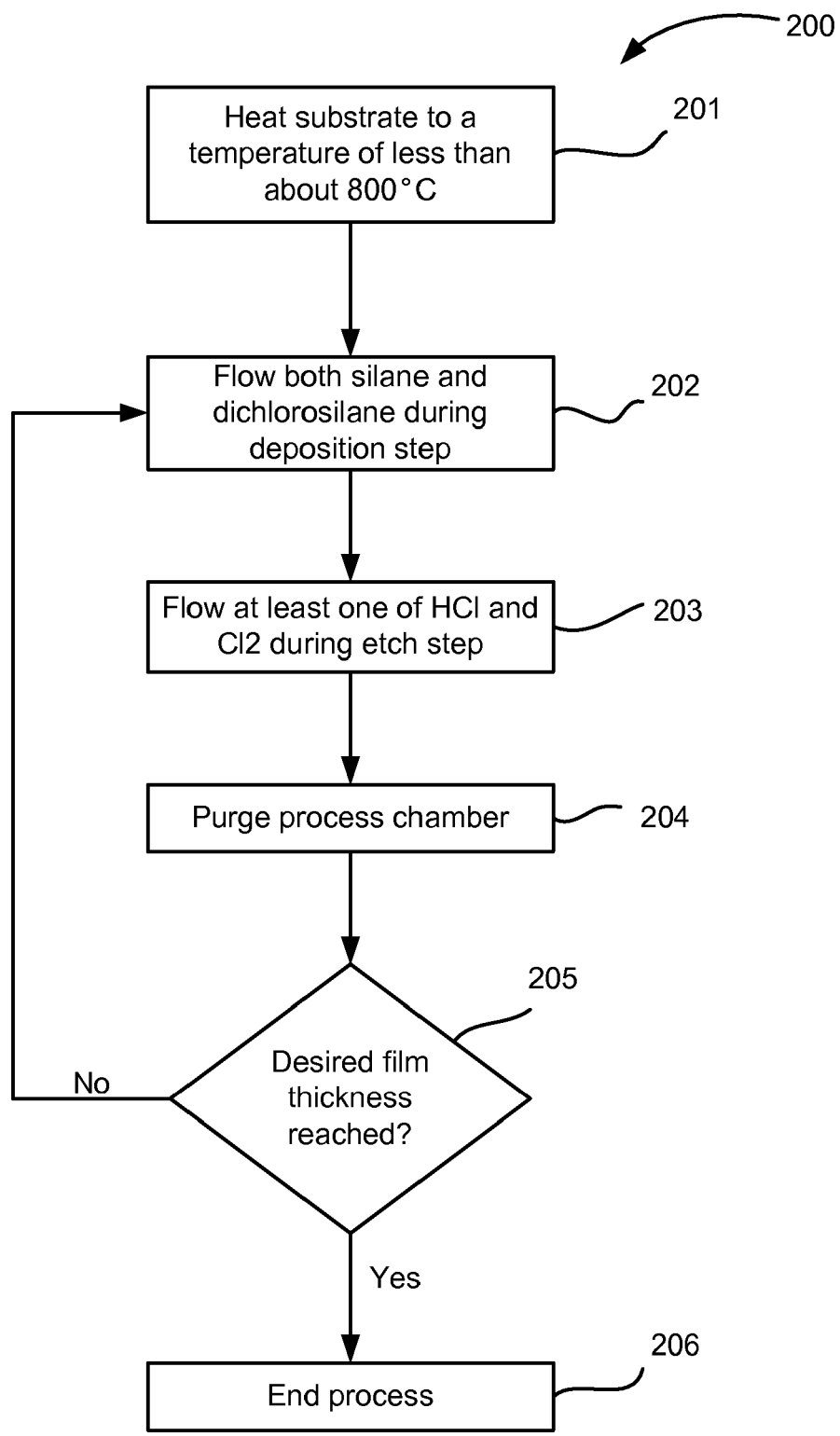
FIG. 2 is a flowchart of a second exemplary method for forming an epitaxial film in accordance with the present invention.

FIG. 2 is a flowchart of a second exemplary method 200 for forming an epitaxial film in accordance with the present invention. With reference to FIG. 2, in step 201, a substrate is loaded into a process chamber and is heated to a temperature of about 800° C. or less. In some embodiments, a lower temperature range may be used during epitaxial film formation, such as less than 750° C., less than 700° C. or less than 650° C.

In step 202, silane and dichlorosilane are flowed into the process chamber, along with a suitable carrier gas and/or dopant(s) so as to form an epitaxial film on the substrate. In some embodiments, about 10 sccm to about 100 sccm of silane may be employed, as may be about 10 sccm to about 100 sccm of dichlorosilane. A pressure in a range of about 5 Torr to about 50 Torr may be employed. Deposition may be performed for about 2 to 250 seconds, and more preferably about 5 to 10 seconds. In some embodiments, an $SiH_4$ to DCS ratio of greater than 1 may be employed, such as 2:1, 3:1, 4:1, 5:1, 7:1, 10:1, etc., ($SiH_4$:DCS). Other flow rates, pressures, temperatures, times and/or $SiH_4$:DCS ratios may be used.

In step 203, an etchant gas such as HCl and/or $Cl_2$ is flowed into the process chamber, along with a suitable carrier gas so as to etch material deposited during step 202. For example, the substrate may be etched with about 50 sccm to about 500 sccm of hydrogen chloride (HCl) as the etchant at a chamber pressure of about 5 Torr to about 100 Torr for about 2 to 250 seconds, and more preferably about 5 to 10 seconds. Other etchants, flow rates, pressures and/or times may be used.

In step 204, after the etch cycle, a purge cycle may be conducted for about 2 to 250 seconds, and more preferably about 5 to 10 seconds. Other purge times may be used.

In step 205, a determination is made whether the desired epitaxial film thickness has been reached. If so, the process ends in step 206; otherwise, the process returns to step 202 to deposit additional epitaxial material on the substrate.

The foregoing description discloses only exemplary embodiments of the invention. Modifications of the above disclosed apparatus and methods which fall within the scope of the invention will be readily apparent to those of ordinary skill in the art. For instance, a lower temperature range may be used during epitaxial film formation, such as less than 750° C., less than 700° C. or less than 650° C.

Accordingly, while the present invention has been disclosed in connection with exemplary embodiments thereof, it should be understood that other embodiments may fall within the spirit and scope of the invention, as defined by the following claims.

The invention claimed is:

1. A method of forming an epitaxial layer comprising:
   providing a substrate;
   heating the substrate to a temperature of less than about 800° C.;
   performing a selective epitaxial film formation process comprising at least one deposition step and at least one etching step:
   wherein the deposition step and etching step are alternated;
   wherein the deposition step includes flowing silane and dichlorosilane each at a flow rate from about 10 to 100 sccm at a deposition pressure from about 5 to 50 Torr; and
   wherein the etching step includes flowing at least one of hydrogen chloride and chlorine.

2. The method of forming an epitaxial layer of claim 1 wherein the selective epitaxial film formation processes further comprises at least one purging step.

3. The method of forming an epitaxial layer of claim 1 wherein heating the substrate comprises heating the substrate to a temperature of less than about 750° C.

4. The method of forming an epitaxial layer of claim 1 wherein heating the substrate comprises heating the substrate to a temperature of less than about 700° C.

5. The method of forming an epitaxial layer claim 1 wherein heating the substrate comprises heating the substrate to a temperature of less than about 650° C.

6. A method of forming an epitaxial layer comprising:
   providing a substrate;
   heating the substrate to a temperature of less than about 800° C.; and
   performing a selective epitaxial film formation process on the substrate so as to form the epitaxial layer by employing both silane and dichlorosilane as silicon sources during the selective epitaxial film formation process;
   wherein a ratio of silane to dichlorosilane is greater than 1.

7. The method of forming an epitaxial layer of claim 6 wherein the ratio of silane to dichlorosilane is greater than 2.

8. The method of forming an epitaxial layer of claim 7 wherein the ratio of silane to dichlorosilane is greater than 5.

9. A method of forming an epitaxial layer comprising:
   providing a substrate;
   heating the substrate to a temperature of less than about 800° C.; and
   performing a selective epitaxial film formation process on the substrate so as to form the epitaxial layer by employing both silane and dichlorosilane as silicon sources during the selective epitaxial film formation process;
   wherein performing the selective epitaxial film formation process comprises:
   flowing silane and dichlorosilane; and
   flowing an etching gas that includes at least one of hydrogen chloride (HCl) and chlorine ($Cl_2$).

10. The method of forming an epitaxial layer of claim 9, further comprising performing a deposition step followed by an etching step.

11. The method of forming an epitaxial layer of claim 9 wherein heating the substrate comprises heating the substrate to a temperature of less than about 750° C.

12. The method of claim 9 wherein heating the substrate comprises heating the substrate to a temperature of less than about 700° C.

13. The method of claim 9 wherein heating the substrate comprises heating the substrate to a temperature of less than about 650° C.

14. A method of forming an epitaxial layer comprising:
   providing a substrate;
   heating the substrate to a temperature of less than about 800° C.; and
   performing a selective epitaxial film formation process on the substrate so as to form the epitaxial layer by employing both silane and dichlorosilane as silicon sources during the selective epitaxial film formation process;
   wherein performing the selective epitaxial film formation process comprises performing a deposition step followed by an etching step;
   wherein performing the deposition step includes providing a flow of silane and a flow of dichlorosilane; and
   wherein performing the deposition step includes flowing silane and dichlorosilane for up to about 10 seconds.

15. The method of forming an epitaxial layer of claim 14 wherein heating the substrate comprises heating the substrate to a temperature of less than about 750° C.

16. The method of claim 14 wherein heating the substrate comprises heating the substrate to a temperature of less than about 700° C.

17. The method of claim 14 wherein heating the substrate comprises heating the substrate to a temperature of less than about 650° C.

18. A method of forming an epitaxial layer comprising:
   providing a substrate;
   heating the substrate to a temperature of less than about 800° C.; and
   performing a selective epitaxial film formation process on the substrate so as to form the epitaxial layer by employing both silane and dichlorosilane as silicon sources during the selective epitaxial film formation process;
   wherein performing the selective epitaxial film formation process comprises performing a deposition step followed by an etching step;
   wherein performing the etching step includes flowing an etching gas that includes at least one of hydrogen chloride (HCl) and chlorine ($Cl_2$); and
   wherein the etching step includes flowing etching gas for up to about 10 seconds.

19. The method of forming an epitaxial layer of claim 18 wherein heating the substrate comprises heating the substrate to a temperature of less than about 750° C.

20. The method of claim 18 wherein heating the substrate comprises heating the substrate to a temperature of less than about 700° C.

21. The method of claim 18 wherein heating the substrate comprises heating the substrate to a temperature of less than about 650° C.

* * * * *